United States Patent
Chun et al.

(10) Patent No.: US 9,417,526 B2
(45) Date of Patent: Aug. 16, 2016

(54) PHOTORESIST COMPOSITION

(71) Applicant: SAMSUNG DISPLAY CO., LTD., Yongin, Gyeonggi-Do (KR)

(72) Inventors: Jun Chun, Yongin-si (KR); Jeong-Min Park, Seoul (KR); Sung-Kyun Park, Suwon-si (KR); Ji-Hyun Kim, Suwon-si (KR); Jin-Ho Ju, Seoul (KR); Hyoc-Min Youn, Hwaseong-si (KR); Dong-Myung Kim, Hwaseong-si (KR); Jin-Sun Kim, Hwaseong-si (KR); Tai-Hoon Yeo, Hwaseong-si (KR); Byung-Uk Kim, Hwaseong-si (KR)

(73) Assignee: SAMSUNG DISPLAY CO., LTD., Yongin, Gyeonggi-do (KR)

( * ) Notice: Subject to any disclaimer, the term of this patent is extended or adjusted under 35 U.S.C. 154(b) by 0 days.

(21) Appl. No.: 14/573,624

(22) Filed: Dec. 17, 2014

(65) Prior Publication Data
US 2015/0205204 A1 Jul. 23, 2015

(30) Foreign Application Priority Data
Jan. 20, 2014 (KR) .................. 10-2014-0006654

(51) Int. Cl.
*G03F 7/004* (2006.01)
*G03F 7/038* (2006.01)
*G03F 7/30* (2006.01)
*C08F 220/10* (2006.01)
(Continued)

(52) U.S. Cl.
CPC ............ *G03F 7/0388* (2013.01); *C08F 212/34* (2013.01); *C08F 220/10* (2013.01); *C08F 220/16* (2013.01); *C08F 220/18* (2013.01); *C08F 220/26* (2013.01); *G03F 7/30* (2013.01); *H01L 21/0274* (2013.01); *H01L 21/31138* (2013.01); *H01L 51/102* (2013.01); *G02F 2001/13625* (2013.01)

(58) Field of Classification Search
CPC ......... G03F 7/004; G03F 7/0388; G03F 7/30; G03F 7/40; G03F 7/0045; G03F 7/0048; G03F 7/0397; G03F 7/0392; C08F 220/10; C08F 220/16; C08F 220/18; C08F 220/26; C08F 212/02; C08F 212/34; H01L 51/102; H01L 21/0274; H01L 21/31138; H01L 27/1214; G02F 2001/13625
USPC ....... 526/318, 326, 320, 347.1; 257/E21.027, 257/E31.256; 438/30, 161
See application file for complete search history.

(56) References Cited

U.S. PATENT DOCUMENTS 6,136,500 A * 10/2000 Kobayashi .............. G03F 7/004
430/270.1
6,767,694 B2 * 7/2004 Kido .................... G02F 1/13458
257/E21.027

(Continued)

FOREIGN PATENT DOCUMENTS

JP         2011095662 A      5/2011

*Primary Examiner* — Amanda C Walke
(74) *Attorney, Agent, or Firm* — Lee & Morse, P.C.

(57) ABSTRACT

A photoresist composition includes an acid-labile polymer that is decomposable by reaction with an acid, a photoacid generator, an organic base having a $pK_a$ value of 9 or less and a solvent. Based on 100 parts by weight of the acid-labile polymer, the photoacid generator is about 1 to about 30 parts by weight, and the organic base is about 0.1 to about 5 parts by weight. The solvent is about 50 to about 90 wt % based on the total weight of the composition.

10 Claims, 2 Drawing Sheets

(51) Int. Cl.
*C08F 220/26* (2006.01)
*C08F 220/16* (2006.01)
*C08F 220/18* (2006.01)
*C08F 212/34* (2006.01)
*H01L 51/10* (2006.01)
*H01L 21/027* (2006.01)
*H01L 21/311* (2006.01)
*G02F 1/1362* (2006.01)

(56) References Cited

U.S. PATENT DOCUMENTS

| | | | | |
|---|---|---|---|---|
| 6,828,167 B2 * | 12/2004 | Kim | ............... | G02F 1/13458 257/E27.111 |
| 6,844,134 B2 * | 1/2005 | Choi | ............... | G03F 7/0046 430/270.1 |
| 6,887,646 B1 | 5/2005 | Fujiwara et al. | | |
| 6,902,862 B2 * | 6/2005 | Takahashi | ............... | G03F 7/0045 430/270.1 |
| 6,989,224 B2 * | 1/2006 | Adams | ............... | G03F 7/0392 430/270.1 |
| 6,999,152 B2 * | 2/2006 | Park | ............... | G02F 1/136227 349/144 |
| 7,016,007 B2 * | 3/2006 | Chang | ............... | G02F 1/13458 257/59 |
| 7,202,016 B2 * | 4/2007 | Miyaji | ............... | G03F 7/038 430/270.1 |
| 7,776,512 B2 * | 8/2010 | Kodama | ............... | C07C 309/06 430/270.1 |
| 7,879,137 B2 * | 2/2011 | Parekh | ............... | G03F 7/70933 261/101 |
| 7,979,528 B2 * | 7/2011 | Eisenberg | ............... | H04L 29/06 709/224 |
| 8,158,326 B2 * | 4/2012 | Kodama | ............... | G03F 7/0382 430/270.1 |
| 8,399,182 B2 * | 3/2013 | Lim | ............... | G02F 1/133555 430/316 |
| 8,563,214 B2 * | 10/2013 | Kikuchi | ............... | G03F 7/0226 430/165 |
| 8,871,423 B2 * | 10/2014 | Yun | ............... | G03F 7/004 430/270.1 |
| 8,932,800 B2 * | 1/2015 | Takita | ............... | G03F 7/0045 430/280.1 |
| 2002/0076641 A1 * | 6/2002 | Choi | ............... | G03F 7/0392 430/270.1 |
| 2002/0111509 A1 * | 8/2002 | Maeda | ............... | C08F 220/28 560/205 |
| 2002/0172886 A1 * | 11/2002 | Momota | ............... | G03F 7/0045 430/170 |
| 2008/0213699 A1 * | 9/2008 | Moon | ............... | G03F 7/0392 430/286.1 |
| 2011/0200941 A1 | 8/2011 | Masunaga et al. | | |
| 2011/0212391 A1 | 9/2011 | Masunaga et al. | | |
| 2012/0052441 A1 | 3/2012 | Sagehashi et al. | | |
| 2012/0184101 A1 | 7/2012 | Yasuda et al. | | |
| 2013/0224657 A1 | 8/2013 | Ohashi et al. | | |

* cited by examiner

PHOTORESIST COMPOSITION

CROSS-REFERENCE TO RELATED APPLICATION

Korean Patent Application No. 10-2014-0006654, filed on Jan. 20, 2014, in the Korean Intellectual Property Office, and entitled: "Photoresist Composition," is incorporated by reference herein in its entirety.

BACKGROUND

1. Field

Embodiments relate to a photoresist composition.

2. Description of the Related Art

In a process of manufacturing a semiconductor device or a flat panel display, photolithography may be performed to form component patterns. Photolithography includes exposure and developing. A photoresist having photosensitivity may be used.

SUMMARY

Embodiments are directed to a photoresist composition includes an acid-labile polymer that can be decomposed by reaction with an acid, a photoacid generator; an organic base having a $pK_a$ value of 9 or less, and a solvent. Based on 100 parts by weight of the acid-labile polymer, the photoacid generator is about 1 to about 30 parts by weight and the organic base is about 0.1 to about 5 parts by weight. The solvent is about 50 to about 90 wt % based on the total weight of the composition.

The organic base may include at least one selected from the group of aniline, triethanolamine, p-toluidine, and diethanolamine.

The acid-labile polymer may include at least one of repeating units represented by Chemical Formulas 2 and 3 below:

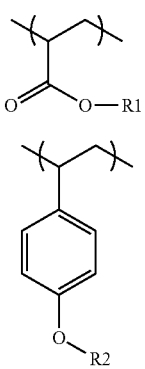

[Chemical Formula 2]

[Chemical Fomula 3]

wherein R1 and R2 are each at least one selected from the group of an acetal group, a linear or branched alkyl group, an alkyl silicon group, a silicon alkoxy group, a 2-tetrahydropyranyl group, a vinyl ether group, a 2-tetrahydrofuranyl group, a 2,3-propylenecarbonate group, a methoxy ethoxy ethyl group, and an acetoxy ethoxy ethyl group.

The acid-labile polymer may have a copolymer portion represented by any one of Chemical Formulas 4a to 4c below:

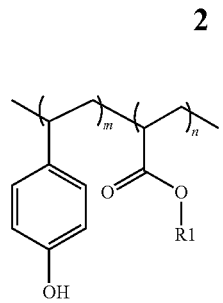

[Chemical Formula 4a]

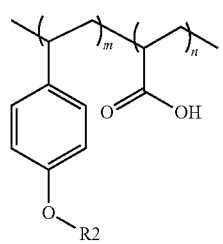

[Chemical Formula 4b]

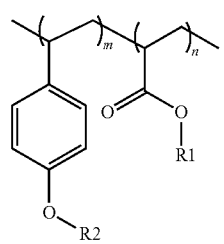

[Chemical Formula 4c]

wherein m and n are an integer of 0 to about 100, and the case where both m and n are 0 is excluded, and R1 and R2 are each selected from the group of hydrogen (H), a linear or branched alkyl group, an acetal group, a 2-tetrahydropyranyl group, a vinyl ether group, a 2-tetrahydrofuranyl group, a 2,3-propylenecarbonate group, a methoxy ethoxy ethyl group, and an acetoxy ethoxy ethyl group.

The acid-labile polymer may be a copolymer represented by Chemical Formula 6 below:

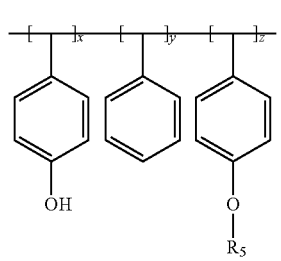

[Chemical Formula 6]

wherein $0.1 \leq x/(x+y+x) \leq 0.9$, $0 \leq y/(x+y+x) \leq 0.3$, $0.1 \leq z/(x+y+x) \leq 0.9$, and $R_5$ is an acetal group or a ketal group, and a molecular weight of the copolymer is about 1,000 to about 500,000.

The photoacid generator may include one or more selected from the group of a sulfonium salt-based compound, an iodonium salt-based compound, a sulfonyldiazomethane-based compound, an N-sulfonyloxyimide-based compound, and a sulfonate-based compound.

The photoresist composition may include at least one of a melamine-based crosslinking agent and a silane coupling agent.

Embodiments are also directed to a method of forming a device pattern for a display, the method including forming an etching target material layer on a substrate, coating the photoresist composition on the etching target material layer to form a photoresist layer, and subjecting the photoresist layer to exposure and development.

The display may be any one of an organic light-emitting display, a liquid crystal display, and an electrophoretic display.

The device pattern may be a wiring pattern or an electrode pattern.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
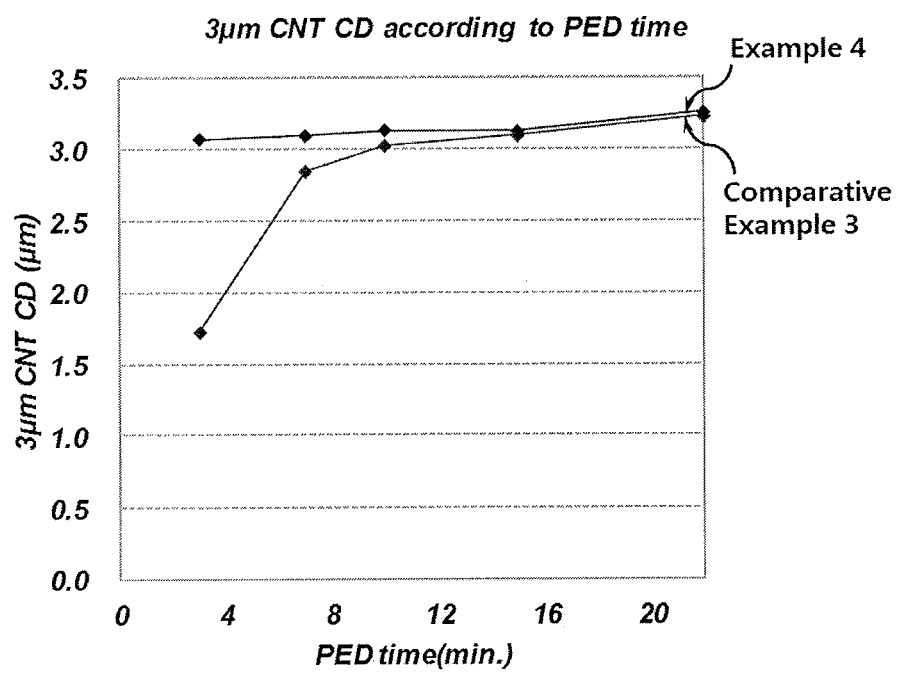
FIG. 1 illustrates a graph showing results of post-exposure delay (PED) margin test for photoresist compositions of Example 4 and Comparative Example 3.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Like reference numerals refer to like elements throughout.

The terminology used herein is for the purpose of describing particular embodiments only and is not construed as limiting thereof. As used herein, the singular forms "a," "an" and "the" are intended to include the plural forms as well, unless the context clearly indicates otherwise. It will be further understood that the terms "comprises" and/or "comprising," when used in this specification, specify the presence of mentioned component, step, operation and/or element, but do not exclude the presence or addition of one or more other components, steps, operations and/or elements.

Unless otherwise defined, all terms used herein (including technical and scientific terms) have the same meaning as commonly understood by those skilled in the relevant art. It will be further understood that terms, such as those defined in commonly used dictionaries, should be interpreted as having a meaning that is consistent with their meaning in the context of the relevant art and will not be interpreted in an ideal or excessively formal sense unless clearly defined in the present specification.

Hereinafter, a detailed description will be given of embodiments. Throughout the description, R, R1, R2, etc., which are substituents represented in Chemical Formulas may be the same as or different from each other in the respective Chemical Formulas. Further, even when there are substituents that are identically represented by R1 or R2 in different Chemical Formulas, they may differ from each other in the respective Chemical Formulas.

According to an embodiment, a photoresist composition includes an acid-labile polymer that can be decomposed by reaction with an acid, a photoacid generator (PAG), an organic base having a $pK_a$ value of 9 or less, and a solvent. The photoresist composition may further include a suitable additive as desired.

The photoresist composition may include, based on 100 parts by weight of the acid-labile polymer, 1~30 parts by weight of the photoacid generator and 0.1~5 parts by weight of the organic base. The photoresist composition may include 50~90 wt % of the solvent based on the total weight of the composition.

The acid-labile polymer may include an acid-labile group which can be decomposed by reaction with an acid.

The acid-labile group included in the acid-labile polymer may be decomposed by an acid generated from the photoacid generator. The reaction mechanism where the acid-labile group of the acid-labile polymer is decomposed by the acid ($H^+$) generated from the photoacid generator may be simply represented by Scheme 1 below:

[Scheme 1]

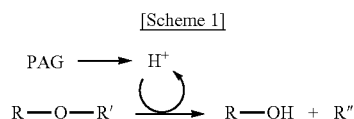

wherein R' is the acid-labile group.

The reaction where the acid-labile group is decomposed as in Scheme 1 may be referred to as deprotection.

The resin (R—OH) deprotected by the acid generated from the photoacid generator in Scheme 1 may become soluble in an alkaline aqueous solution, and thus may have developability in an alkaline aqueous solution. In this embodiment, the photoresist composition may include the acid-labile polymer, which may react as described above. Thus, the photoresist composition may be a chemically amplified photoresist composition.

The acid-labile group may be present in a state of being bound to any one of repeating units of the acid-labile polymer.

For example, in the case where the acid-labile polymer has a repeating unit represented by Chemical Formula 1 below, the deprotection mechanism of the acid-labile polymer may be shown as in Scheme 2 below:

[Chemical Formula 1]

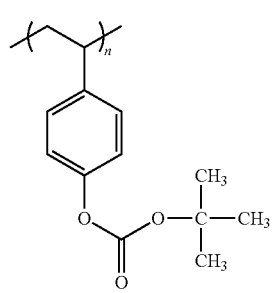

[Scheme 2]

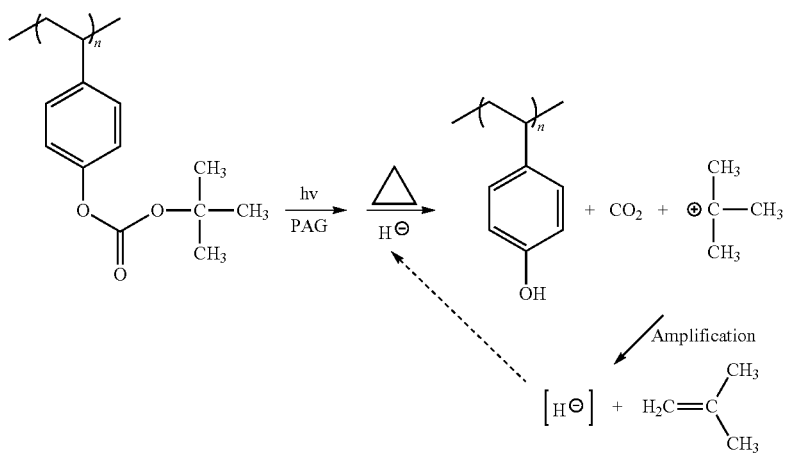

In Chemical Formula 1 and Scheme 2, a t-butyloxycarbonyl group is the acid-labile group.

The acid-labile polymer may include at least one of repeating units having the acid-labile group, as represented by Chemical Formulas 2 and 3 below:

[Chemical Formula 2]

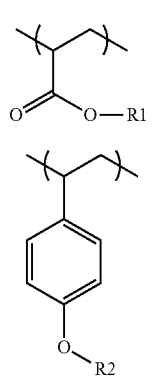

[Chemical Fomula 3]

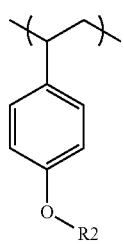

wherein R1 and R2 are acid-labile groups, and, for example, are each at least one selected from the group of an acetal group, a linear or branched alkyl group, an alkyl silicon group, a silicon alkoxy group, a 2-tetrahydropyranyl group, a vinyl ether group, a 2-tetrahydrofuranyl group, a 2,3-propylenecarbonate group, a methoxy ethoxy ethyl group, and an acetoxy ethoxy ethyl group.

Examples of the vinyl ether group include vinyl ethers including methyl vinyl ether, ethyl vinyl ether, n-butyl vinyl ether, t-butyl vinyl ether, 2-chloroethyl vinyl ether, 1-methoxyethyl vinyl ether, 1-benzyloxyethyl vinyl ether, etc., isopropenyl ethers including isopropenyl methyl ether, isopropenyl ethyl ether, etc., cyclic vinyl ethers including 3,4-dihydro-2H-pyran, etc., and divinyl ethers including butanediol-1,4-divinyl ether, ethylene glycol divinyl ether, triethylene glycol divinyl ether, etc.

According to an embodiment, the acid-labile polymer may include the acid-labile group (R1, R2) having high reactivity as above in order to efficiently cause deprotection even without a post-exposure bake (PEB) process.

Chemical Formula 2 has the repeating unit of an acrylic resin, and Chemical Formula 3 has the repeating unit of a novolac resin. The acid-labile polymer may include at least one of an acrylic polymer and a novolac polymer, or may include a copolymer made up of an acrylic polymer and a novolac polymer. For example, the acid-labile polymer may include at least one block copolymer portion made up of an acrylic polymer and a novolac polymer, as represented by Chemical Formulas 4a to 4c below:

[Chemical Formula 4a]

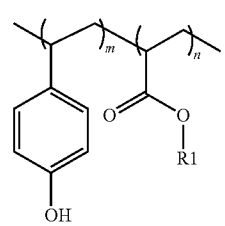

[Chemical Formula 4b]

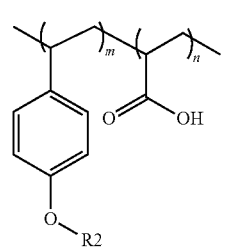

[Chemical Formula 4c]

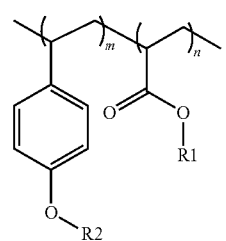

wherein n and m are an integer of 1~100, and R1 and R2 are as defined in Chemical Formulas 2 and 3.

The acid-labile polymer may include a repeating unit having no acid-labile group. Examples of such a repeating unit include repeating units represented by Chemical Formulas 5a to 5c below:

[Chemical Formula 5a]

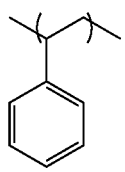

[Chemical Formula 5b]

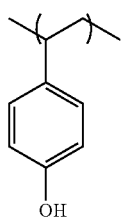

[Chemical Formula 5c]

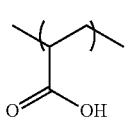

An example of the acid-labile polymer may include a copolymer represented by Chemical Formula 6 below:

[Chemical Formula 6]

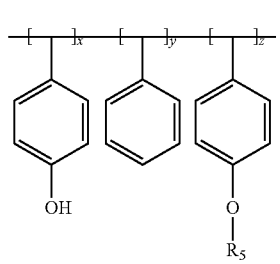

wherein $0.1 \leq x/(x+y+x) \leq 0.9$, $0 \leq y/(x+y+x) \leq 0.3$, $0.1 \leq z/(x+y+x) \leq 0.9$, and a molecular weight is 1,000~500,000, and $R_5$ is an acetal group or a ketal group.

The photoacid generator may include one or more selected from the group of a sulfonium salt-based compound, an iodonium salt-based compound, a sulfonyldiazomethane-based compound, an N-sulfonyloxyimide-based compound, and a sulfonate-based compound.

For example, the photoacid generator may include at least one selected from the group of triphenylsulfonium triflate, triphenylsulfonium antimonate, diphenyliodonium triflate, diphenyliodonium antimonate, methoxydiphenyliodonium triflate, di-t-butyldiphenyliodonium triflate, 2,6-dinitrobenzyl sulfonate, pyrogallol tris(alkylsulfonate), N-hydroxysuccinimide triflate, norbornene-dicarboximide triflate, triphenylsulfonium nonaflate, diphenyliodonium nonaflate, methoxydiphenyliodonium nonaflate, di-t-butyldiphenyliodonium nonaflate, N-hydroxysuccinimide nonaflate, norbornene-dicarboximide nonaflate, triphenylsulfonium perfluorobutane sulfonate, triphenylsulfonium perfluorooctane sulfonate (PFOS), diphenyliodonium PFOS, methoxydiphenyliodonium PFOS, di-t-butyldiphenyliodonium triflate, N-hydroxysuccinimide PFOS, and norbornene-dicarboximide PFOS.

According to an embodiment, the photoresist composition may include the photoacid generator in a comparatively large amount. For example, the photoacid generator may be 1~30 parts by weight based on 100 parts by weight of the acid-labile polymer.

If the amount of the photoacid generator is lower, deprotection of the acid-labile polymer could be inefficient, undesirably decreasing developability, and increasing a period of time to sufficiently cause deprotection (which is referred to as "post-exposure delay (PED) time"), undesirably degrading mass productivity.

In contrast, if the amount of the photoacid generator is too high, deprotection may continue even after the post-exposure reaction time that is determined in the process. Thus, the shape of the pattern formed on the photoresist in each process may not be uniform under conditions that the period of time from exposure to development is not uniform. Briefly, process uniformity may decrease.

The organic base may have a $pK_a$ value of 9 or less. The organic base may react with the acid generated by the photoacid generator and the acid generated during deprotection of the acid-labile polymer to thus absorb the acid. The organic base may control the rates of activation of the photoacid generator and of deprotection. The organic base may have a $pK_a$ value of 1 or more. If the basic properties are deficient due to a too low $pK_a$ value of the organic base, acid consumption capacity may become poor, and activation of the photoacid generator and deprotection may not be efficiently controlled.

In contrast, if the $pK_a$ value of the organic base is greater than 9, the basic properties may be strong and the acid absorption capacity may be great, so that the absorption capacity of the acid generated from the photoacid generator upon initial exposure may be excellent. However, because the organic base is added in a comparatively small amount, the organic base may be consumed early. If the acid generated after exposure or during development is not properly consumed by the organic base, the deprotection of the acid-labile polymer may not be efficiently controlled. Consequently, the shape of the developed photoresist pattern may not be uniform, or deprotection may continue undesirably for the period of time between exposure and development.

The organic base may be 0.1~5 parts by weight based on 100 parts by weight of the acid-labile polymer. If the amount of the organic base is low, the acid generated by the photoacid generator and the acid generated during the deprotection of the acid labile polymer may not be sufficiently absorbed, which may make it difficult to efficiently control the activation of the photoacid generator and the deprotection. In contrast, if the amount of the organic base is high, activation of the acid may be excessively suppressed, undesirably deteriorating developability of the photoresist.

The organic base may include at least one selected from the group of aniline, triethanolamine, p-toluidine, and diethanolamine.

The solvent may be used to mix respective components of the photoresist composition. The solvent may include at least one selected from the group of propylene glycol monomethyl ether acetate, ethyl ethoxy propionate, cyclohexanone, dipropylene glycol monomethyl ether acetate, n-butylacetate, isobutyl acetate, ethylene glycol monomethyl acetate, ethylene glycol n-butyl acetate, diethylene glycol dimethyl ether, dipropylene glycol monomethyl acetate, diethylene glycol methyl ether, dipropylene glycol n-butyl ether, tripropylene glycol n-butyl ether, tripropylene glycol methyl ether, propylene glycol methyl ether acetate, propylene glycol diacetate, methyl 3-ethoxy propionate, methanol, ethanol, methyl cellosolve monomethyl ether, ethyl cellosolve acetate, diethylene glycol monomethyl ether, methylethyl ketone, 4-hydroxy 4-methyl 2-pentanone, ethyl 2-hydroxy-2-methylproprionate, and butyl cellosolve acetate.

The solvent may be present in an amount of 50~90 wt % based on the total weight of the photoresist composition. If the amount of the solvent is higher, the viscosity of the photoresist composition may decrease, making it difficult to form a film. In contrast, if the amount thereof is insufficient, it may be difficult to mix respective components of the photoresist composition.

The photoresist composition may further include a surfactant at a concentration of 30 ppm~200 ppm. The photoresist composition may further include at least one of a melamine-based crosslinking agent and a silane coupling agent.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Example 1

Preparation of Photoresist Composition

With respect to 100 parts by weight of an acid-labile polymer represented by Chemical Formula 7 below, 5 parts by weight of 2-methyl-a-(5-(((propylsulfonyl)oxy)imino)-2 (5H)-thienylidene) benzeneacetonitrile as a photoacid generator and 0.5 parts by weight of aniline (a $pK_a$ value of 4.62) as an organic base were dissolved in a propyleneglycol monomethylether acetate solvent. The solvent was used in such an amount that the amount of the non-solvent components was 20 wt %. The dissolved mixture solution was filtered by a 0.1 μm millipore filter, yielding a photoresist composition.

[Chemical Formula 7]

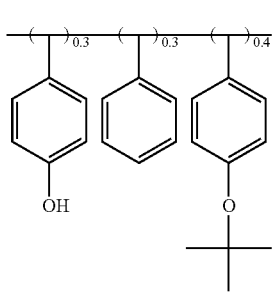

Example 2

A photoresist composition was prepared in the same manner as in Example 1, with the exception that triethanolamine (a $pK_a$ value of 7.74) was used as the organic base instead of aniline (a $pK_a$ value of 4.62).

Example 3

A photoresist composition was prepared in the same manner as in Example 1, with the exception that p-toluidine (a $pK_a$ value of 8.7) was used as the organic base instead of aniline (a $pK_a$ value of 4.62).

Example 4

A photoresist composition was prepared in the same manner as in Example 1, with the exception that diethanolamine (a $pK_a$ value of 8.9) was used as the organic base instead of aniline (a $pK_a$ value of 4.62).

Comparative Example 1

A photoresist composition was prepared in the same manner as in Example 1, with the exception that 0.05 parts by weight of diethanolamine (a $pK_a$ value of 8.9) was used as the organic base instead of aniline (a $pK_a$ value of 4.62).

Comparative Example 2

A photoresist composition was prepared in the same manner as in Example 1, with the exception that 6 parts by weight of diethanolamine (a $pK_a$ value of 8.9) was used as the organic base instead of aniline (a $pK_a$ value of 4.62).

Comparative Example 3

A photoresist composition was prepared in the same manner as in Example 1, with the exception that benzylamine (a $pK_a$ value of 9.35) was used as the organic base instead of aniline (a $pK_a$ value of 4.62).

Comparative Example 4

A photoresist composition was prepared in the same manner as in Example 1, with the exception that allylamine (a $pK_a$ value of 9.49) was used as the organic base instead of aniline (a $pK_a$ value of 4.62).

Comparative Example 5

A photoresist composition was prepared in the same manner as in Example 1, with the exception that triethylamine (a $pK_a$ value of 10.67) was used as the organic base instead of aniline (a $pK_a$ value of 4.62).

Comparative Example 6

A photoresist composition was prepared in the same manner as in Example 1, with the exception that tributylamine (a $pK_a$ value of 10.87) was used as the organic base instead of aniline (a $pK_a$ value of 4.62).

Test Example 1

Measurement of Sensitivity

The photoresist composition of each of Examples 1 to 4 and Comparative Examples 1 to 6 was coated on a SiNx-deposited glass substrate having a size of 370 cm×470 cm by using a slit coater, dried up to 0.5 torr in a vacuum chamber (which is referred to as "vacuum chamber dry" (VCD)), and prebaked on a hot plate at 100° C. for 90 seconds, thereby forming a photoresist in the form of a film with a thickness of about 2.0 μm.

A pattern mask having an opening size of 3 μm×3 μm was disposed on the photoresist, irradiated with UV light by using a UV exposure machine at a broadband intensity of about 10 mW/cm$^2$, developed at 23° C. for 70 seconds by using a 2.38 wt % tetramethylammonium hydroxide aqueous solution, and then cleaned with deionized water for 60 seconds, thereby forming a contact hole. The critical dimension (CD) of the contact hole was measured by using a scanning electron microscope (SEM), and thus the exposure dose for forming a contact hole with a CD of 3.0 μm×3.0 μm was determined as sensitivity.

Test Example 2

Measurement of Resolution

This test was performed under the same conditions as in Test Example 1 for measurement of sensitivity, with the exception that the CD of the contact hole was gradually decreased, and the minimum CD at which the uniform shape of the contact hole is formed without distortion of the shape was determined as resolution.

Test Example 3

Measurement of Dispersion

This test was performed under the same conditions as in Test Example 1 for measurement of sensitivity, with the exception that the substrate was subdivided into 20 regions, and the contact holes were formed in the respective regions, and the CD and the shape of the contact holes were measured. The case where the CD dispersion of contact hole per position was less than 5% was judged to be ○, and the case where the CD dispersion of contact hole per position was 5~10% was judged to be Δ, and the case where the CD dispersion of contact hole per position was more than 10% was judged to be X.

Test Example 4

Measurement of PED (Post-Exposure Delay) Margin

This test was performed under the same conditions as in Test Example 1 for measurement of sensitivity, with the exception that, while the photoresist film was developed by being allowed to stand for 30 minutes after exposure, the CD of the contact hole was measured at intervals of 3 minutes for the period of time for which the film was allowed to stand, and the time at which the CD of the contact hole was not changed any more was measured. In this case, the time at which a change in CD of the contact hole within 5% was observed was represented as a PED margin time.

The test results are given in Table 1 below.

TABLE 1

|  | Organic base | Amount | Sensitivity | Resolution | Dispersion | PED margin |
|---|---|---|---|---|---|---|
| Ex. 1 | Aniline (pKa 4.62) | 0.5 wt parts | 20 mJ | 1.8 μm | ○ | 3 min. |
| Ex. 2 | Triethanolamine (pKa 7.74) | 0.5 wt parts | 23 mJ | 1.8 μm | ○ | 3 min. |
| Ex. 3 | p-Toluidine (pKa 8.7) | 0.5 wt parts | 32 mJ | 2.0 μm | Δ | 6 min. |
| Ex. 4 | Diethanolamine (pKa 8.9) | 0.5 wt parts | 29 mJ | 1.9 μm | ○ | 3 min. |
| C. Ex. 1 | Diethanolamine (pKa 8.9) | 0.05 wt parts | 20 mJ | 2.2 μm | Δ | 9 min. |
| C. Ex. 2 | Diethanolamine (pKa 8.9) | 6 wt parts | 65 mJ | 2.6 μm | ○ | 3 min. |
| C. Ex. 3 | Benzylamine (pKa 9.35) | 0.5 wt parts | 40 mJ | 2.3 μm | x | 12 min. |
| C. Ex. 4 | Allylamine (pKa 9.49) | 0.5 wt parts | 39 mJ | 2.5 μm | x | 15 min. |
| C. Ex. 5 | Triethylamine (pKa 10.67) | 0.5 wt parts | 45 mJ | 2.4 μm | Δ | 12 min. |
| C. Ex. 6 | Tributylamine (pKa 10.87) | 0.5 wt parts | 50 mJ | 2.6 μm | x | 20 min. |

The sensitivity was judged to be good when light dose was 35 mJ or less, the resolution was judged to be good when the CD of the contact hole was uniform up to 2.0 μm or less, and the PED margin was judged to be good when the time was 7 minutes or less. In the case of PED, the waiting time between exposure and development is typically about 3 minutes, but may be prolonged to 7 minutes, and thus is set to 7 minutes. The case where the PED margin was 3 minutes or less was judged to be very good. As is apparent from Table 1, the photoresist films resulting from the compositions of Examples 1 to 4 exhibited superior developability.

The PED margin test results of Example 4 and Comparative Example 3 are shown in Table 2 below and FIG. 1.

TABLE 2

|  | C. Ex. 3 | Ex. 4 |
|---|---|---|
| PED (min.) | CNT CD (μm) | |
| 3 | 1.72 | 3.07 |
| 7 | 2.84 | 3.09 |

TABLE 2-continued

| PED (min.) | C. Ex. 3 | Ex. 4 |
| --- | --- | --- |
| | CNT CD (μm) | |
| 10 | 3.02 | 3.13 |
| 15 | 3.09 | 3.12 |
| 22 | 3.22 | 3.25 |

As is apparent from Table 2 and FIG. 1, in the case where the photoresist is formed of the photoresist composition according to an embodiment, it is developed within 3 minutes after exposure, thus shortening the process time.

The photoresist composition may be applied to a wiring formation process (a back plane (BP) process), etc. of a display.

The photoresist composition according to an embodiment may provide a photoresist that may be developed without PEB because of an increase in the amount of the photoacid generator (PAG) and improvement in reactivity of the acid-labile group to thus reduce the entire process and the work time.

In the case where the reaction completion rate between the acid ($H^+$) generated from the photoacid generator and the acid-labile polymer is low, the deprotection time may increase, which may have an influence on an after-development-inspection critical dimension (ADI CD) dispersion, undesirably causing process defects. The photoresist formed of the photoresist composition according to an embodiment has a high reaction rate, thereby shortening the PED time, which is a period of time to completely react the acid ($H^+$) generated in the exposure region with the acid-labile group bound to the acid-labile polymer in the photoresist.

The acid-labile polymer may further react by additional diffusion of the acid ($H^+$) after the time of completion of reaction, namely, the estimated reaction completion time in the process. In such a case, if a time delay occurs that is equal to or longer than the standard process time up to development after exposure, an ADI CD dispersion may be affected, and process defects may thereby occur.

With reference to FIGS. 2A to 2D, stages of a method of forming a wiring pattern on a substrate of a display using the photoresist composition according to an embodiment are described below.

Figure 2A:
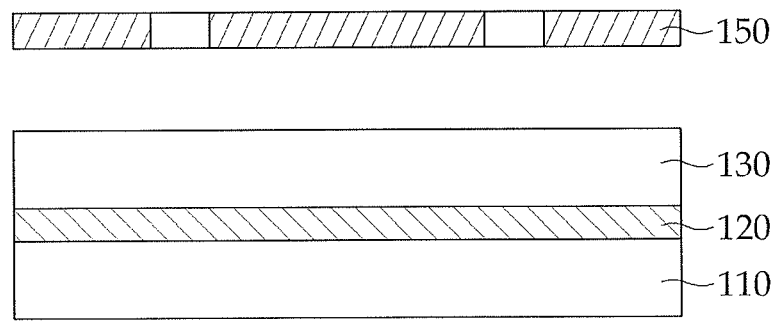
FIGS. 2A to 2D illustrate cross-sectional views showing stages of a process of forming a wiring pattern on a substrate of a display.

An etching target material layer 120 and a photoresist layer 130 may be formed on a substrate 110 (FIG. 2A).

The substrate 110 may be formed of an organic material or plastic. The etching target material layer 120 may be formed of a conductive material such as a metal or a transparent conductive oxide. The photoresist layer 130 may be formed of a photoresist composition according to embodiments. For example, the photoresist layer 130 may include a photoresist composition of any one of Examples 1 to 4. Subsequently, a mask 150 may be disposed on the photoresist layer 130 and exposure may be implemented.

Figure 2B:
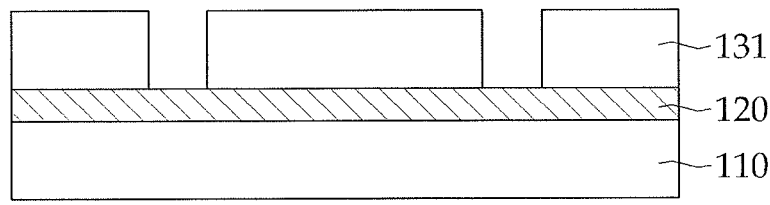

By development after exposure, a photoresist pattern 131 may be formed (FIG. 2B).

Figure 2C:
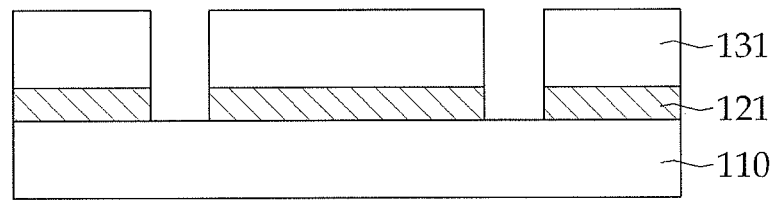
Figure 2D:
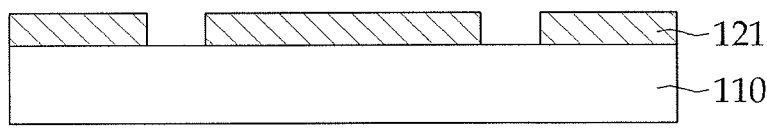

The etching target material layer 120 may be etched by using the photoresist pattern 131 as the mask (FIG. 2C). The photoresist pattern 131 may be removed, thereby forming a device pattern 121 for a display.

Examples of the display to which the photoresist composition may be applied may include an organic light-emitting display, a liquid crystal display, an electrophoretic display, etc., and the device pattern may include a wiring pattern, an electrode pattern, etc.

By way of summation and review, as displays are manufactured to possess high resolution and to have highly integrated devices, the fineness of the component patterns is increasing. As a photoresist for forming such fine patterns, a chemically amplified resist (CAR) is receiving attention.

A CAR includes an acid-labile polymer and a photoacid generator (PAG). The exposed acid-labile polymer is deprotected upon exposure and is removed upon development, thereby forming a pattern. Specifically, an acid (H+) is generated from the photoacid generator by light irradiation, and the acid (H+) amplifies the deprotection of the acid-labile polymer.

In a process using a CAR, activation energy is generally required to cause deprotection of the acid-labile polymer. The activation energy for deprotection is typically supplied by heat. Thus, a post exposure bake (PEB) process for heating the photoresist after exposure is generally implemented. It may be difficult to directly introduce CAR to a process system without a bake unit for PEB.

Embodiments are directed to a chemically amplified photoresist composition that may be developed without a post exposure bake (PEB) process. A CAR made of the photoresist composition according to embodiments includes a large amount of photoacid generator, and may thus be developed without a PEB process. Also, the CAR made of the photoresist composition according to embodiments includes a predetermined organic base, thereby controlling over-reaction of the photoacid generator. The use of the photoresist composition according to embodiments may result in a photoresist pattern having high precision.

Example embodiments have been disclosed herein, and although specific terms are employed, they are used and are to be interpreted in a generic and descriptive sense only and not for purpose of limitation. Accordingly, it will be understood by those of skill in the art that various changes in form and details may be made without departing from the spirit and scope thereof as set forth in the following claims.

What is claimed is:

1. A photoresist composition, comprising:
an acid-labile polymer that is decomposable by reaction with an acid, wherein the acid-labile polymer includes a copolymer represented by Chemical Formula 6 below:

[Chemical Formula 6]

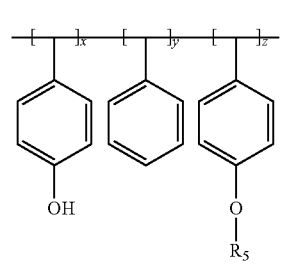

wherein $0.1 \leq x/(x+y+x) \leq 0.9$, $0 \leq y/(x+y+x) \leq 0.3$, $0.1 \leq z/(x+y+x) \leq 0.9$, and $R_5$ is at least one of an acetal group, a ketal group and a t-butyl group, and a molecular weight of the copolymer is about 1,000 to about 500,000;
a photoacid generator;
an organic base having a $pK_a$ value of 9 or less; and
a solvent,
wherein, based on 100 parts by weight of the acid-labile polymer, the photoacid generator is about 1 to about 30 parts by weight, and the organic base is about 0.1 to about 5 parts by weight, and the solvent is about 50 to about 90 wt % based on the total weight of the composition.

2. The photoresist composition as claimed in claim 1, wherein the organic base includes at least one selected from the group of aniline, triethanolamine, p-toluidine, and diethanolamine.

3. The photoresist composition as claimed in claim 1, wherein the acid-labile polymer further includes at least one of repeating units represented by Chemical Formulas 2 and 3 below:

[Chemical Formula 2]

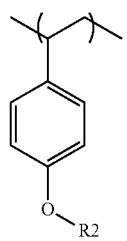

[Chemical Formula 3]

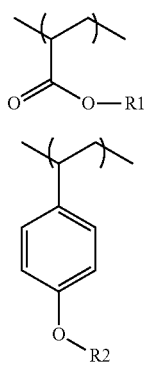

wherein R1 is at least one selected from the group of an acetal group, a linear or branched alkyl group, an alkyl silicon group, a silicon alkoxy group, a 2-tetrahydropyranyl group, a vinyl ether group, a 2-tetrahydrofuranyl group, a 2,3-propylenecarbonate group, a methoxy ethoxy ethyl group, and an acetoxy ethoxy ethyl group, and R2 is at least one selected from the group of a linear or branched alkyl group, an alkyl silicon group, a silicon alkoxy group, a 2-tetrahydropyranyl group, a vinyl ether group, a 2-tetrahydrofuranyl group, a 2,3-propylenecarbonate group, a methoxy ethoxy ethyl group, and an acetoxy ethoxy ethyl group.

4. The photoresist composition as claimed in claim 1, wherein the acid-labile polymer further includes a copolymer portion represented by any one of Chemical Formulas 4a to 4c below:

[Chemical Formula 4a]

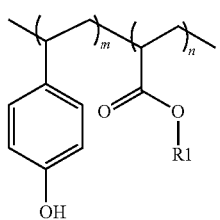

[Chemical Formula 4b]

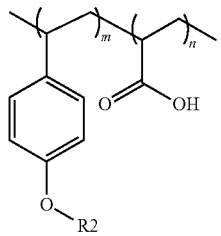

[Chemical Formula 4c]

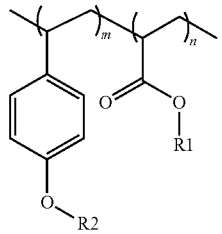

wherein m and n are an integer of 0 to about 100, and the case where both m and n are 0 is excluded, and R1 is selected from the group of hydrogen (H), a linear or branched alkyl group, an acetal group, a 2-tetrahydropyranyl group, a vinyl ether group, a 2-tetrahydrofuranyl group, a 2,3-propylenecarbonate group, a methoxy ethoxy ethyl group, and an acetoxy ethoxy ethyl group, and R2 is selected from the group of hydrogen (H), a linear or branched alkyl group, a 2-tetrahydropyranyl group, a vinyl ether group, a 2-tetrahydrofuranyl group, a 2,3-propylenecarbonate group, a methoxy ethoxy ethyl group, and an acetoxy ethoxy ethyl group.

5. The photoresist composition as claimed in claim 1, wherein the photoacid generator includes one or more selected from the group of a sulfonium salt-based compound, an iodonium salt-based compound, a sulfonyldiazomethane-based compound, an N-sulfonyloxyimide-based compound, and a sulfonate-based compound.

6. The photoresist composition as claimed in claim 1, further comprising at least one of a melamine-based crosslinking agent and a silane coupling agent.

7. The photoresist composition as claimed in claim 1, wherein $R_5$ is t-butyl.

8. A method of forming a device pattern for a display, the method comprising:
    forming an etching target material layer on a substrate;
    coating the photoresist composition as claimed in claim 1 on the etching target material layer to form a photoresist layer; and
    subjecting the photoresist layer to exposure and development.

9. The method as claimed in claim 8, wherein the display is any one of an organic light-emitting display, a liquid crystal display and an electrophoretic display.

10. The method as claimed in claim 8, wherein the device pattern is a wiring pattern or an electrode pattern.

* * * * *